(12) United States Patent
Sharma et al.

(10) Patent No.: US 11,296,087 B2
(45) Date of Patent: Apr. 5, 2022

(54) THIN FILM TRANSISTORS WITH SPACER CONTROLLED GATE LENGTH

(71) Applicant: Intel Corporation, Santa Clara, CA (US)

(72) Inventors: Abhishek A. Sharma, Hillsboro, OR (US); Van H. Le, Portland, OR (US); Gilbert Dewey, Beaverton, OR (US); Shriram Shivaraman, Hillsboro, OR (US); Yih Wang, Portland, OR (US); Tahir Ghani, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/473,592

(22) PCT Filed: Mar. 31, 2017

(86) PCT No.: PCT/US2017/025593
§ 371 (c)(1),
(2) Date: Jun. 25, 2019

(87) PCT Pub. No.: WO2018/182738
PCT Pub. Date: Oct. 4, 2018

(65) Prior Publication Data
US 2020/0152635 A1 May 14, 2020

(51) Int. Cl.
*H01L 29/417* (2006.01)
*H01L 29/49* (2006.01)
(Continued)

(52) U.S. Cl.
CPC .. *H01L 27/10805* (2013.01); *H01L 27/10873* (2013.01); *H01L 29/41733* (2013.01);
(Continued)

(58) Field of Classification Search
CPC . H01L 29/41733; H01L 29/45; H01L 29/458; H01L 29/4908; H01L 29/78669; H01L 27/10805
See application file for complete search history.

(56) References Cited

U.S. PATENT DOCUMENTS

| 6,265,256 B1 | 7/2001 | An et al. |
| 2005/0176188 A1* | 8/2005 | Luo ................... H01L 29/78696 438/158 |

(Continued)

OTHER PUBLICATIONS

International Search Report and Written Opinion dated Dec. 27, 2017 for International Patent Application No. PCT/US2017/025593, 10 pages.

*Primary Examiner* — Stephen M Bradley
*Assistant Examiner* — Gustavo G Ramallo
(74) *Attorney, Agent, or Firm* — Schwabe, Williamson & Wyatt, P.C.

(57) ABSTRACT

Embodiments herein describe techniques for a semiconductor device including a TFT having a gate electrode with a gate length determined by a spacer. Embodiments may include a gate electrode above a substrate, a channel layer above the gate electrode, and a source electrode, a drain electrode, and a spacer above the channel layer. The drain electrode may be separated from the source electrode by the spacer. The drain electrode and the source electrode may have different widths or include different materials. Furthermore, the spacer may overlap with the gate electrode, hence (Continued)

the gate length of the gate electrode may be determined by the spacer width. Other embodiments may be described and/or claimed.

14 Claims, 7 Drawing Sheets

(51) Int. Cl.
H01L 27/108 (2006.01)
H01L 29/45 (2006.01)
H01L 29/51 (2006.01)
H01L 29/66 (2006.01)
H01L 29/786 (2006.01)

(52) U.S. Cl.
CPC ............ *H01L 29/45* (2013.01); *H01L 29/458* (2013.01); *H01L 29/4908* (2013.01); *H01L 29/517* (2013.01); *H01L 29/6656* (2013.01); *H01L 29/66765* (2013.01); *H01L 29/66969* (2013.01); *H01L 29/78669* (2013.01); *H01L 29/78693* (2013.01)

(56) References Cited

U.S. PATENT DOCUMENTS

| | | | |
|---|---|---|---|
| 2006/0237857 A1* | 10/2006 | Bertin | H01L 51/0516 257/427 |
| 2007/0241336 A1 | 10/2007 | Tokioka et al. | |
| 2009/0021661 A1 | 1/2009 | Tsuboi | |
| 2013/0099240 A1* | 4/2013 | Lee | H01L 29/41733 257/59 |
| 2014/0084293 A1* | 3/2014 | Ahn | H01L 29/41733 257/59 |
| 2014/0098315 A1* | 4/2014 | Jung | G02F 1/134309 349/42 |
| 2015/0277199 A1* | 10/2015 | Chang | G02F 1/136286 349/12 |
| 2016/0013294 A1* | 1/2016 | Hou | H01L 27/1288 257/66 |
| 2016/0126344 A1 | 5/2016 | Ellinger et al. | |
| 2016/0336183 A1* | 11/2016 | Yuan | H01L 21/76895 |
| 2017/0053951 A1 | 2/2017 | Sato | |
| 2018/0097075 A1* | 4/2018 | Xu | G09G 3/3225 |

* cited by examiner

THIN FILM TRANSISTORS WITH SPACER CONTROLLED GATE LENGTH

CROSS REFERENCE TO RELATED APPLICATIONS

The present application is a national phase entry under 35 U.S.C. § 371 of International Application No. PCT/US2017/025593, filed Mar. 31, 2017, entitled "THIN FILM TRANSISTORS WITH SPACER CONTROLLED GATE LENGTH", which designated, among the various States, the United States of America. The Specifications of the PCT/US2017/025593 Application is hereby incorporated by reference.

FIELD

Embodiments of the present disclosure generally relate to the field of integrated circuits, and more particularly, to transistors.

BACKGROUND

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the back-end, while leaving the silicon substrate areas for high-speed transistors. TFTs hold great potential for large area and flexible electronics, e.g., displays. Other applications of TFTs may include memory arrays.

TFTs may be fabricated by bottom gate technologies, where a gate electrode of a TFT may be patterned before a channel layer is patterned. Often the gate electrode of a TFT may have a gate length related to a pitch of the source and drain electrodes. Such a pitch may be determined by the lithography technology used in patterning and fabricating the TFT. Furthermore, there may be variations between the gate lengths among multiple TFTs caused by the edge roughness and variations of the pitches between source and drain electrodes of different TFTs. The variations of the gate length may adversely affect the on and off currents of the TFTs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
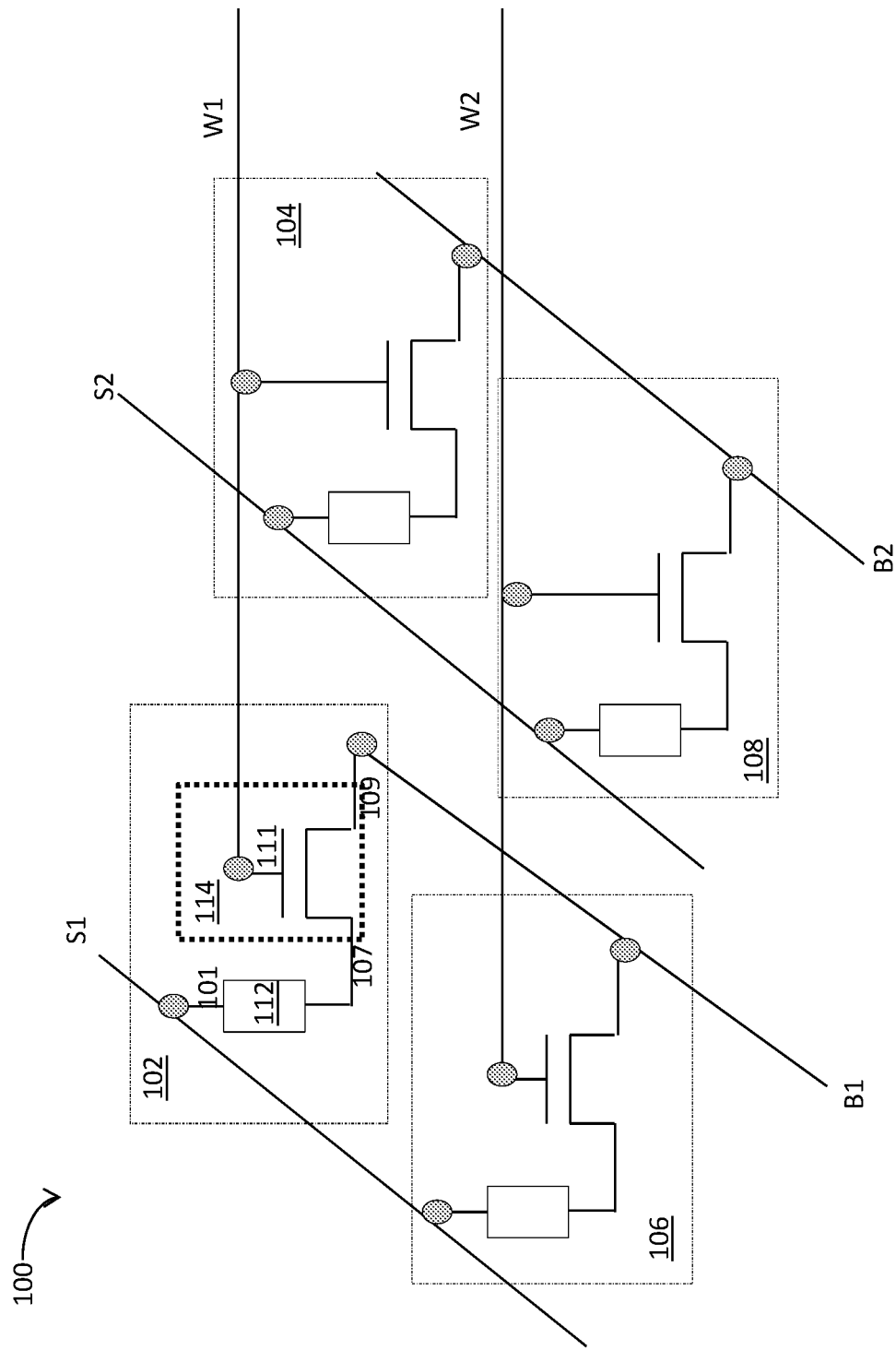
FIG. 1 schematically illustrates a memory array with multiple memory cells wherein a thin-film transistor (TFT) may be a selector of a memory cell, in accordance with various embodiments.

A memory array, e.g., a dynamic random access memory (DRAM), may include a plurality of memory cells, wherein a memory cell may include a selector, e.g., a transistor, to control the access to a storage cell. In embodiments, the storage cell may be a capacitor to store charge, resulting in a 1T1C (one transistor, one capacitor) architecture for the memory cell. When a normal silicon transistor is used as a selector for a memory cell, the transistor may be very leaky, so that the charge stored in a storage cell may not be retained for long due to leakage caused by the transistor. A relatively large capacitor may be used to store enough charge for the storage cell, which may take up a significant substrate area. Sometimes, large capacitors may be implemented by creating a deep trench in a silicon substrate, making the process non-CMOS compatible.

A TFT may be used as a selector of a memory cell in a memory array. When TFTs are fabricated by bottom gate technologies, the gate electrode of a TFT may have a gate length related to a pitch of the source and drain electrodes. Such a pitch may be determined by the lithography technology used in patterning and fabricating the TFT, which may be relatively large. Furthermore, variations between the gate lengths among multiple TFTs caused by the edge roughness and variations of the pitches between source and drain electrodes may further adversely affect the on and off currents of the TFTs. Hence, the write performance and retention time of a memory cell may be impacted adversely due to the changes to the on and off currents of the TFT used as a selector for the memory cell.

Embodiments herein may present techniques to pattern a gate electrode of a TFT with a gate length determined by a spacer. Embodiments herein may also present TFTs with gate lengths shorter than a pitch between source and drain electrodes determined by the lithography technology. As a result, the TFTs may have reduced on and off current change, resulting in improved performance and retention time of the memory cell. Other advantages may include reduced current degradation due to larger source and drain electrodes, better alignment tolerance to gate and thin film semiconductor island, and better tolerance for vias in contact with the source and drain electrodes of the TFTs.

Embodiments herein may present a semiconductor device, which includes a gate electrode above a substrate, a channel layer above the gate electrode, and a source electrode, a drain electrode, and a spacer above the channel layer. The drain electrode may be separated from the source electrode by the spacer. The drain electrode and the source electrode may be made at different steps and may have different widths. For example, the source electrode may have a first width, and the drain electrode may have a second width different from the first width. Compared to a width of the source electrode, or a pitch between source and drain electrodes, the spacer may have a much shorter width. Furthermore, the spacer may overlap with the gate electrode, hence the gate length of the gate electrode may be determined by the spacer width and reduced as well.

Embodiments herein may present a computing device, which may include a circuit board, and a memory device coupled to the circuit board and including a memory array. In more detail, the memory array may include a plurality of memory cells. A memory cell of the plurality of memory cells may include a transistor and a storage cell. The transistor in the memory cell may include a gate electrode coupled to a word line of the memory array, a channel layer above the gate electrode, and a source electrode, a drain electrode, and a spacer, where the source electrode, the drain electrode, and the spacer are above the channel layer. In addition, the source electrode may be coupled to a source line of the memory array, the drain electrode may be coupled to the storage cell, and the storage cell may be coupled to a bit line of the memory array. The drain electrode may be separated from the source electrode by the spacer, and the spacer may overlap with the gate electrode. In embodiments, the source electrode may have a first width, and the drain electrode may have a second width different from the first width.

In embodiments, a method for forming a semiconductor device may include: forming a gate electrode above a substrate, forming a gate dielectric layer conformally covering the gate electrode and the substrate, and forming a channel layer above the gate dielectric layer. The method may also include forming a source electrode above the channel layer, where the source electrode may be separated from another source electrode of an adjacent transistor by a pitch. The method may further include forming a spacer next to the source electrode and above the channel layer, where the spacer may overlap with the gate electrode. In addition, the method may include forming a drain electrode next to the spacer and above the channel layer. In embodiments, the source electrode may have a first width, the spacer may have a second width, and the drain electrode may have a third width, where the sum of the first width, the second width, and the third width may be less than the pitch. Furthermore, since the spacer may overlap with the gate electrode, the gate length of the gate electrode may be determined by the spacer and smaller than the pitch.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B). (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate.

In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a memory array 100 with multiple memory cells (e.g., a memory cell 102, a memory cell 104, a memory cell 106, and a memory cell 108), where a TFT, e.g., a TFT 114, may be a selector of a memory cell, e.g., the memory cell 102, in accordance with various embodiments.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 102 may be coupled in series with the other memory cells of the same row, and may be coupled in parallel with the memory cells of the other rows. The memory array 100 may include any suitable number of one or more memory cells. Although the memory array 100 is shown in FIG. 1 with two rows that each includes two memory cells coupled in series, other embodiments may include other numbers of rows and/or numbers of memory cells within a row. In some embodiments, the number of rows may be different from the number of columns in a memory array. Each row of the memory array may have a same number of memory cells. Additionally, or alternatively, different rows may have different numbers of memory cells.

In embodiments, multiple memory cells, such as the memory cell 102, the memory cell 104, the memory cell 106, and the memory cell 108, may have a similar configuration, such as the 1T1C configuration. For example, the memory cell 102 may include the TFT 114 coupled to a storage cell 112 that may be a capacitor. A memory cell with the 1T1C configuration, e.g., the memory cell 102, may be controlled through multiple electrical connections to read from the memory cells, write to the memory cells, and/or perform other memory operations. In some embodiments, the storage cell 112 may be another type of storage device, e.g., a resistive random access memory (RRAM) cell.

In embodiments, when the storage cell 112 is a capacitor, the storage cell 112 may be switchable between charged or discharged states upon application of an electric current or voltage. The charged or discharged states of the storage cell 112 may be taken to represent the two values of a bit, conventionally called 0 and 1. The storage cell 112 may be individually controllable by the TFT 114 as a selector to switch between the charged or discharged states.

The TFT 114 may be a selector for the memory cell 102. A word line W1 of the memory array 100 may be coupled to a gate electrode 111 of the TFT 114. When the word line W1 is active, the TFT 114 may select the storage cell 112. A source line S1 of the memory array 100 may be coupled to an electrode 101 of the storage cell 112, while another electrode 107 of the storage cell 112 may be shared with the TFT 114. In addition, a bit line B1 of the memory array 100 may be coupled to another electrode, e.g., an electrode 109 of the TFT 114. The shared electrode 107 may be a source electrode or a drain electrode of the TFT 114, while the electrode 109 may be a drain electrode or a source electrode of the TFT 114. A drain electrode and a source electrode may be used interchangeably herein. Additionally, a source line and a bit line may be used interchangeably herein.

In various embodiments, the memory cells and the transistors, e.g., the memory cell 102 and the TFT 114, included in the memory array 100 may be formed in back-end-of-line (BEOL). For example, the TFT 114 may be illustrated as a TFT 714 shown in FIG. 7 at the BEOL. Accordingly, the memory array 100 may be formed in higher metal layers, e.g., metal layer 3 and/or metal layer 4, of the integrated circuit above the active substrate region, and may not occupy the active substrate area that is occupied by conventional transistors or memory devices.

Figure 2:
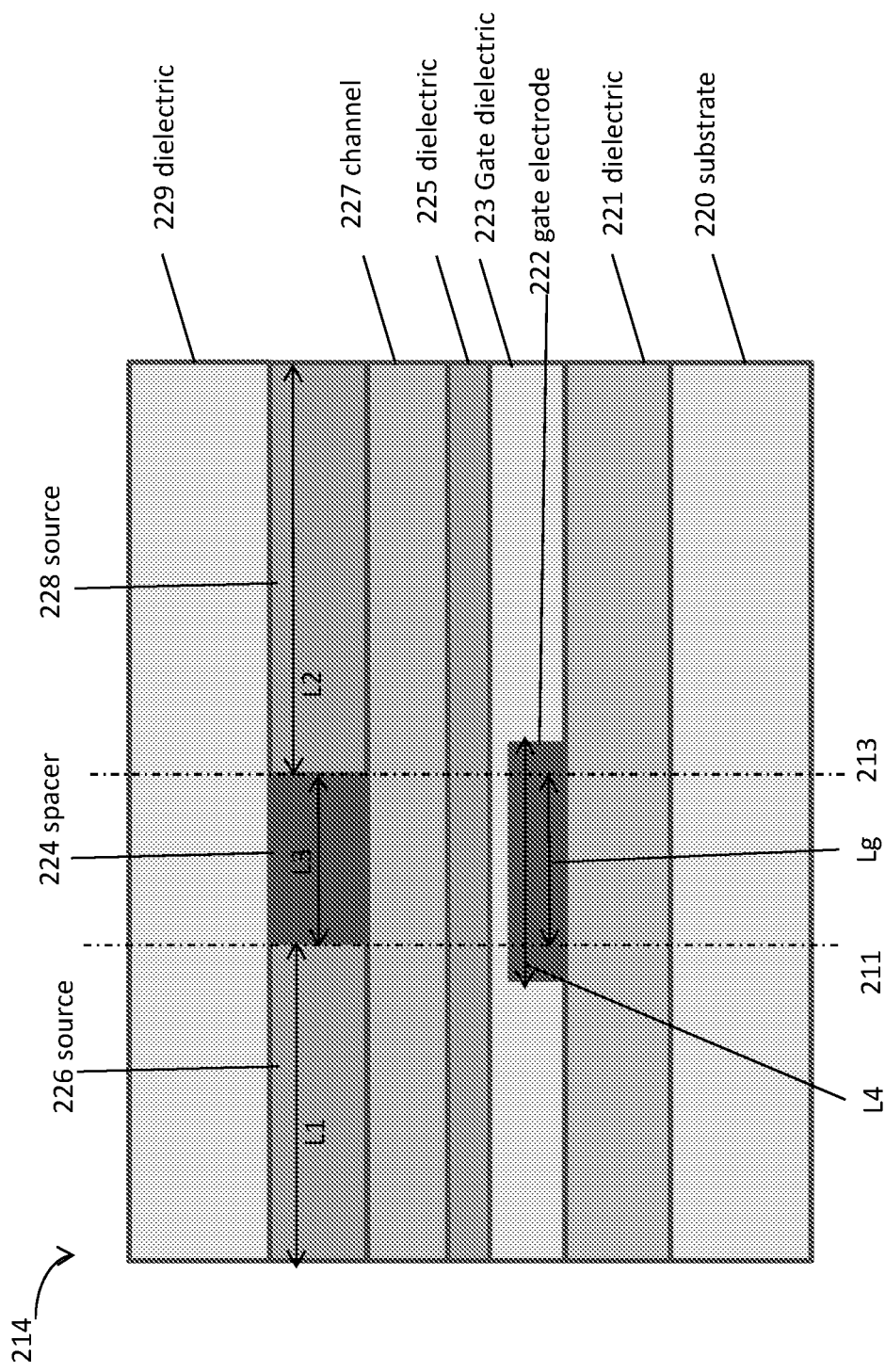
FIG. 2 schematically illustrates a diagram of a TFT having a gate electrode with a gate length determined by a spacer, in accordance with some embodiments.

FIG. 2 schematically illustrates a diagram of a TFT, e.g., a TFT 214, having a gate electrode, e.g., a gate electrode 222, with a gate length determined by a spacer, e.g., a spacer 224, in accordance with some embodiments. The TFT 214 may be an example of the TFT 114 in FIG. 1. The structure of the TFT 214 may be for illustration purpose only and is not limiting. The TFT 214 may have other configurations including more or fewer layers than are shown in FIG. 2.

In embodiments, the TFT 214 may include a substrate 220, a dielectric layer 221 above the substrate 220, a gate electrode 222 above the dielectric layer 221, a gate dielectric layer 223 conformally covering the gate electrode 222 and the substrate 220, another dielectric layer 225 above the gate dielectric layer 223, and a channel layer 227 above another dielectric layer 225. In addition, the TFT 214 may include a source electrode 226, a drain electrode 228, and the spacer 224 above the channel layer 227, where the drain electrode 228 may be separated from the source electrode 226 by the spacer 224. In embodiments, the spacer 224 may overlap with the gate electrode 222. Furthermore, a top dielectric layer 229 may be above the source electrode 226, the drain electrode 228, and the spacer 224.

In embodiments, the substrate 220 may be a glass substrate, such as soda lime glass or borosilicate glass, a metal substrate, a plastic substrate, or another suitable substrate. Other inter-metal dielectric layer may be formed on the substrate. The substrate 220 may include an inter-metal dielectric layer, or other devices, not shown for clarity.

In embodiments, the dielectric layer 221, another dielectric layer 225, or the top dielectric layer 229, may be optional. The dielectric layer 221, another dielectric layer 225, or the top dielectric layer 229 may include a silicon oxide (SiO) film, a silicon nitride (SiN) film, $O_3$-tetraethylorthosilicate (TEOS), $O_3$-hexamethyldisiloxane (HMDS), plasma-TEOS oxide layer, or other suitable materials.

In embodiments, the gate electrode 222 may be formed as a single layer or a stacked layer using one or more conductive films including a conductive material. For example, the gate electrode 222 may include gold (Au), platinum (Pt), ruthenium (Ru), iridium (Ir), titanium (Ti), aluminum (Al), copper (Cu), tantalum (Ta), tungsten (W), tantalum nitride (TaN), titanium nitride (TiN), iridium-tantalum alloy (Ir—Ta), indium-tin oxide (ITO), the like, and/or a combination thereof.

In embodiments, the gate dielectric layer 223 may include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer 223 may include silicon oxide ($SiO_2$), silicon nitride ($SiN_x$), yttrium oxide ($Y_2O_3$), silicon oxynitride ($SiO_xN_y$), aluminum oxide ($Al_2O_3$), hafnium(IV) oxide ($HfO_2$), tantalum oxide ($Ta_2O_5$), titanium dioxide ($TiO_2$), or other materials.

In embodiments, the channel layer 227 may include a material comprising amorphous silicon, zinc (Zn), or oxygen (O), such as, indium gallium zinc oxide (IGZO), amorphous InGaZnO (a-IGZO), crystal-like InGaZnO (c-IGZO), GaZnON, ZnON, or C-Axis Aligned Crystal (CAAC). The channel layer 227 may have a thickness in a range of about 10 nm to about 100 nm.

In embodiments, the source electrode 226 and the drain electrode 228 may include one or more conductive films including a conductive material. For example, the source electrode 226 and the drain electrode 228 may include Ti, molybdenum (Mo), Au, Pt, Al, nickel (Ni), Cu, chromium (Cr), Ru, iridium (Ir), Ta, W, an alloy of Ti, Mo, Au, Pt, Al, Ni, Cu, Cr, Ru, Ir, Ta, W. or another suitable material. The source electrode 226 and the drain electrode 228 may be patterned at a different time, and may have different width. For example, the source electrode 226 may have a first width L1, and the drain electrode 228 may have a second width L2 different from the first width. Additionally and alternatively, the source electrode 226 may include a first conductive material, and the drain electrode 228 may include a second conductive material different from the first conductive material.

In embodiments, the spacer 224 may separate the source electrode 226 and the drain electrode 228. The spacer 224 may include a first dielectric material, and the top dielectric layer 229 may include a second dielectric material different from the first dielectric material. The spacer 224 may have a width L3 that is about 5% to 15% of the width L1 of the source electrode 226. In embodiments, the spacer 224 may overlap with the gate electrode 222, (e.g., such that it is possible to draw a straight vertical line, e.g., a vertical line 211 or a vertical line 213 that is orthogonal to a plane of the substrate 220, connecting one point within the first component to another point within the second component). In some embodiments, the spacer 224 may fully overlap with the gate electrode 222 (with all portions of the spacer 224 located vertically above or below the gate electrode 222), as shown in FIG. 2. In addition, the gate electrode 222 may partially overlap with the source electrode 226 and the drain electrode 228. In some other embodiments, the spacer 224 may partially overlap with the gate electrode 222.

As shown in FIG. 2, a gate length, Lg, of the gate electrode 222 may be determined by the spacer 224, where the gate length may be a same as the width of the spacer 224, e.g., Lg=L3. On the other hand, the gate electrode 222 may have a physical length L4, which may be a same or slightly larger than the width of the spacer 224. In some embodiments, the physical length L4 may be 10% larger than the width L3 of the spacer 224.

Figure 3:
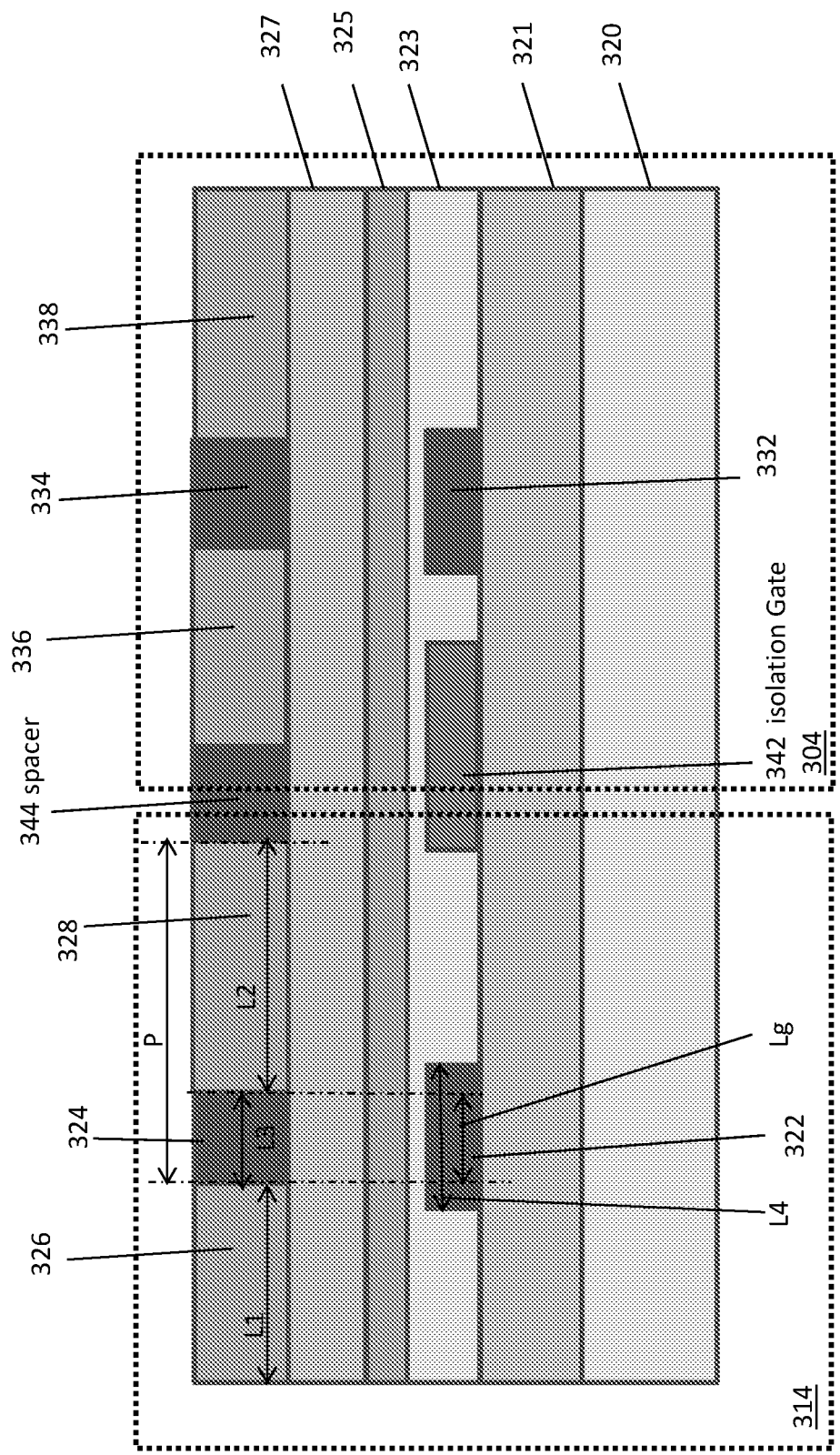
FIG. 3 schematically illustrates a diagram of two TFTs, wherein a source electrode of a TFT may be separated from a source electrode of an adjacent TFT by a pitch, in accordance with some embodiments.

FIG. 3 schematically illustrates a diagram of two TFTs, e.g., a TFT 314 and a TFT 304, where a source electrode of a TFT may be separated from a source electrode of an adjacent TFT by a pitch, in accordance with some embodiments. The TFT 314 or the TFT 304 may be an example of the TFT 114 in FIG. 1, or the TFT 214 in FIG. 2.

In embodiments, the TFT 314 may include a substrate 320, a dielectric layer 321 above the substrate 320, a gate electrode 322 above the dielectric layer 321, a gate dielectric layer 323 conformally covering the gate electrode 322 and the substrate 320, another dielectric layer 325 above the gate dielectric layer 323, and a channel layer 327 above another dielectric layer 325. In addition, the TFT 314 may include a source electrode 326, a drain electrode 328, and a spacer 324 above the channel layer 327, where the drain electrode 328 is separated from the source electrode 326 by the spacer 324. In embodiments, the spacer 324 may overlap (e.g., fully overlap) with the gate electrode 322.

In embodiments, similarly, the TFT 304 may include the substrate 320, and the dielectric layer 321 above the substrate 320, which are shared with the TFT 314. A gate electrode 332 may be above the dielectric layer 321. The gate dielectric layer 323 may be shared with the TFT 314 and may conformally cover the gate electrode 332 and the substrate 320. The TFT 304 may further share with the TFT 314 another dielectric layer 325 above the gate dielectric layer 323, and the channel layer 327 above the another dielectric layer 325. In addition, the TFT 304 may include a source electrode 336, a drain electrode 338, and a spacer 334 above the channel layer 327, wherein the drain electrode 338 is separated from the source electrode 336 by the spacer 334. In embodiments, the spacer 334 may overlap (e.g., fully overlap) with the gate electrode 332.

In embodiments, the TFT 314 and the TFT 304 may be adjacent to each other and separated by a spacer 344 and an isolation gate 342. The isolation gate 342 may be an isolated electrode that is not coupled to any conductive lines (e.g., to receive a control signal). The distance between the source electrode 326 and the source electrode 336 may be a pitch P, which is determined by the lithography technology used to pattern and fabricate the TFT 314 and the TFT 304. In addition, the source electrode 326 may have a first width L1, the drain electrode 328 may have a second width L2, and the spacer 324 may have a third width L3, where the sum of L2 and L3 may be equal to the pitch P. In addition, the spacer 324 may overlap (e.g., fully overlap) with the gate electrode 322, and the gate electrode 322 may have a gate length Lg=L3. Therefore, the gate length Lg may be shorter than the pitch P, with fewer variations. As a result, the TFTs may have reduced on and off current change, resulting in improved performance and retention time of a memory cell where the TFT 314 may be used as a selector. At the meantime, the gate electrode 322 may have a physical length L4 at least the same or larger than Lg. For example, the physical length L4 may be within a range of [L3, 1.1*L3], compared to the width of the spacer 322.

Figure 4:
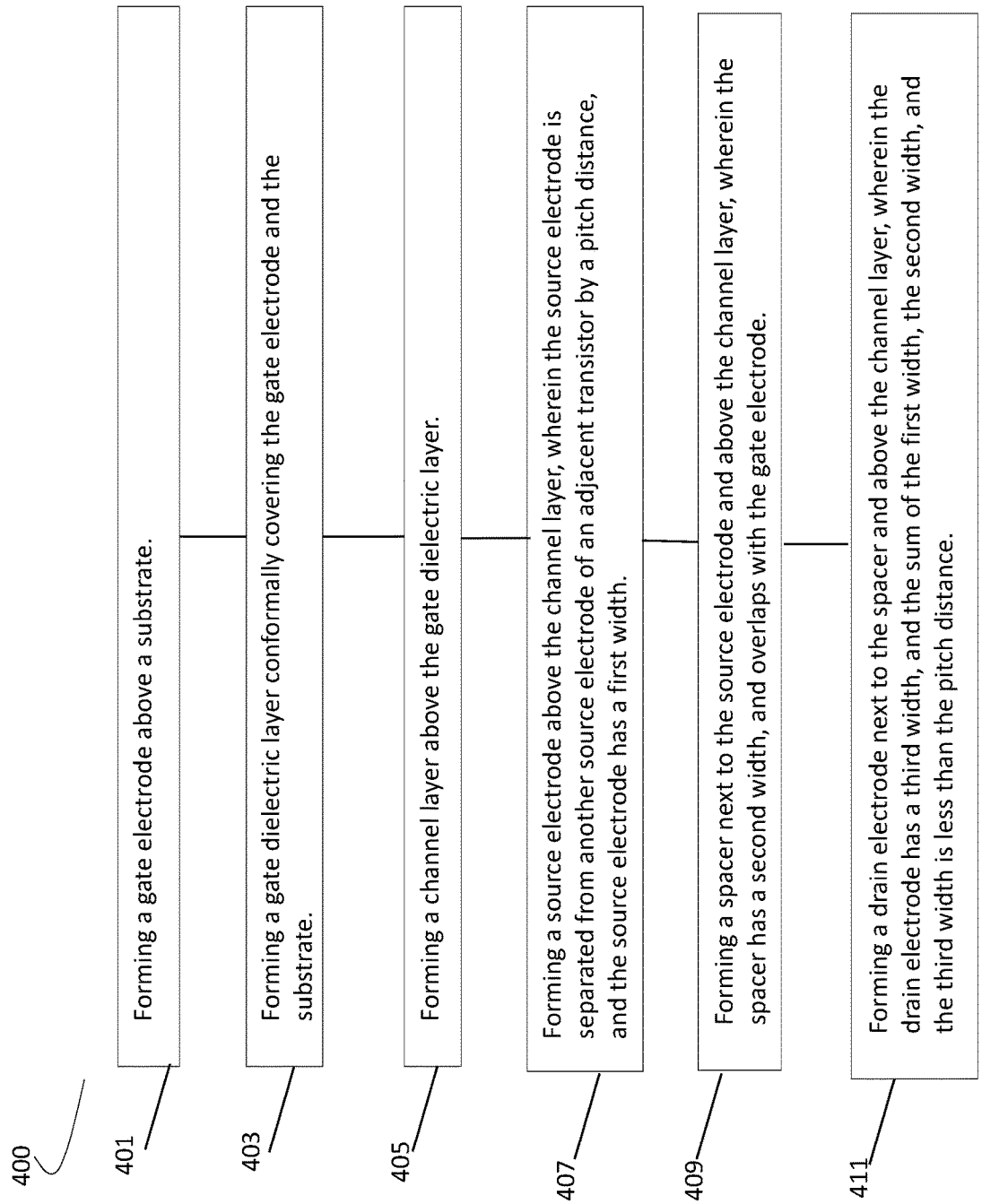
FIG. 4 illustrates a process for forming a TFT having a gate electrode with a gate length determined by a spacer, in accordance with some embodiments.

FIG. 4 illustrates a process 400 for forming a TFT having a gate electrode with a gate length determined by a spacer, in accordance with some embodiments. In embodiments, the process 400 may be applied to form the TFT 114 in FIG. 1, the TFT 214 in FIG. 2, the TFT 314, or the TFT 304 in FIG. 3.

At block 401, the process 400 may include forming a gate electrode above a substrate. For example, the process 400 may include forming the gate electrode 222 above the substrate 220 as shown in FIG. 2.

At block 403, the process 400 may include forming a gate dielectric layer conformally covering the gate electrode and the substrate. For example, the process 400 may include forming the gate dielectric layer 223 conformally covering the gate electrode 222 and the substrate 220, as shown in FIG. 2. In embodiments, the gate dielectric layer, e.g., the gate dielectric layer 223, may include silicon and oxygen, silicon and nitrogen, yttrium and oxygen, silicon, oxygen, and nitrogen, aluminum and oxygen, hafnium and oxygen, tantalum and oxygen, or titanium and oxygen.

At block 405, the process 400 may include forming a channel layer above the gate dielectric layer. For example, the process 400 may include forming the channel layer 227 above the gate dielectric layer 223, as shown in FIG. 2. In embodiments, the channel layer, e.g., the channel layer 227, may include amorphous silicon, zinc (Zn), or oxygen (O).

At block 407, the process 400 may include forming a source electrode above the channel layer. For example, the process 400 may include forming the source electrode 226 above the channel layer 227, as shown in FIG. 2. As another example, the process 400 may include forming the source electrode 326 above the channel layer 327, as shown in FIG. 3. In embodiments, the source electrode, e.g., the source electrode 326, may be separated from another source electrode of an adjacent transistor, e.g., the source electrode 336 of the TFT 304, by a pitch, as shown in FIG. 3.

At block 409, the process 400 may include forming a spacer next to the source electrode and above the channel layer. For example, the process 400) may include forming the spacer 224 next to the source electrode 226 and above the channel layer 227, as shown in FIG. 2. In embodiments, the spacer 224 may have a width smaller than a width of the source electrode 226. For example, the spacer 224 may have a width that is about 5% to 15% of the width of the source electrode 226. Furthermore, the spacer, e.g., the spacer 224, may overlap (e.g., fully overlap) with the gate electrode, e.g., the gate electrode 222.

At block 411, the process 400 may include forming a drain electrode next to the spacer and above the channel layer. For example, the process 400 may include forming the drain electrode 228 next to the spacer 224 and above the channel layer 227. As another example, the process 400 may include forming the drain electrode 328 next to the spacer 324 and above the channel layer 327, as shown in FIG. 3. In embodiments, a sum of a width of the drain electrode 328, a width of the source electrode 326, and a width of the spacer 324 may be less than the pitch P, as shown in FIG. 3.

In embodiments, the source electrode and the drain electrode, e.g., the source electrode 226 and the drain electrode 228 may be formed at different times, and hence with different materials and widths. For example, the source electrode 226 may include a first conductive material, and the drain electrode 228 may include a second conductive material different from the first conductive material. Similarly, the source electrode 226 may have a first width, and the drain electrode 228 may have a second width different from the first width. In some other embodiments, the source electrode 226 and the drain electrode 228 may have a same width or include a same material. The source electrode or the drain electrode may include Au, Pt, Ru, Ir, Ti, Al, Cu. Ta, tungsten (W), iridium-tantalum alloy (Ir—Ta), or indium-tin oxide (ITO).

In addition, the process 400 may include additional operations. For example, the process 400 may include forming a top dielectric layer above the source electrode, the drain electrode, and the spacer. In embodiments, the spacer may include a first dielectric material, and the top dielectric layer may include a second dielectric material different from the first dielectric material. Furthermore, the process 400 may include forming a second source electrode above the channel layer, where the second source electrode may be separated from the first source electrode by the pitch, and forming a second spacer between the drain electrode and the second source electrode and above the channel layer.

Figure 5:
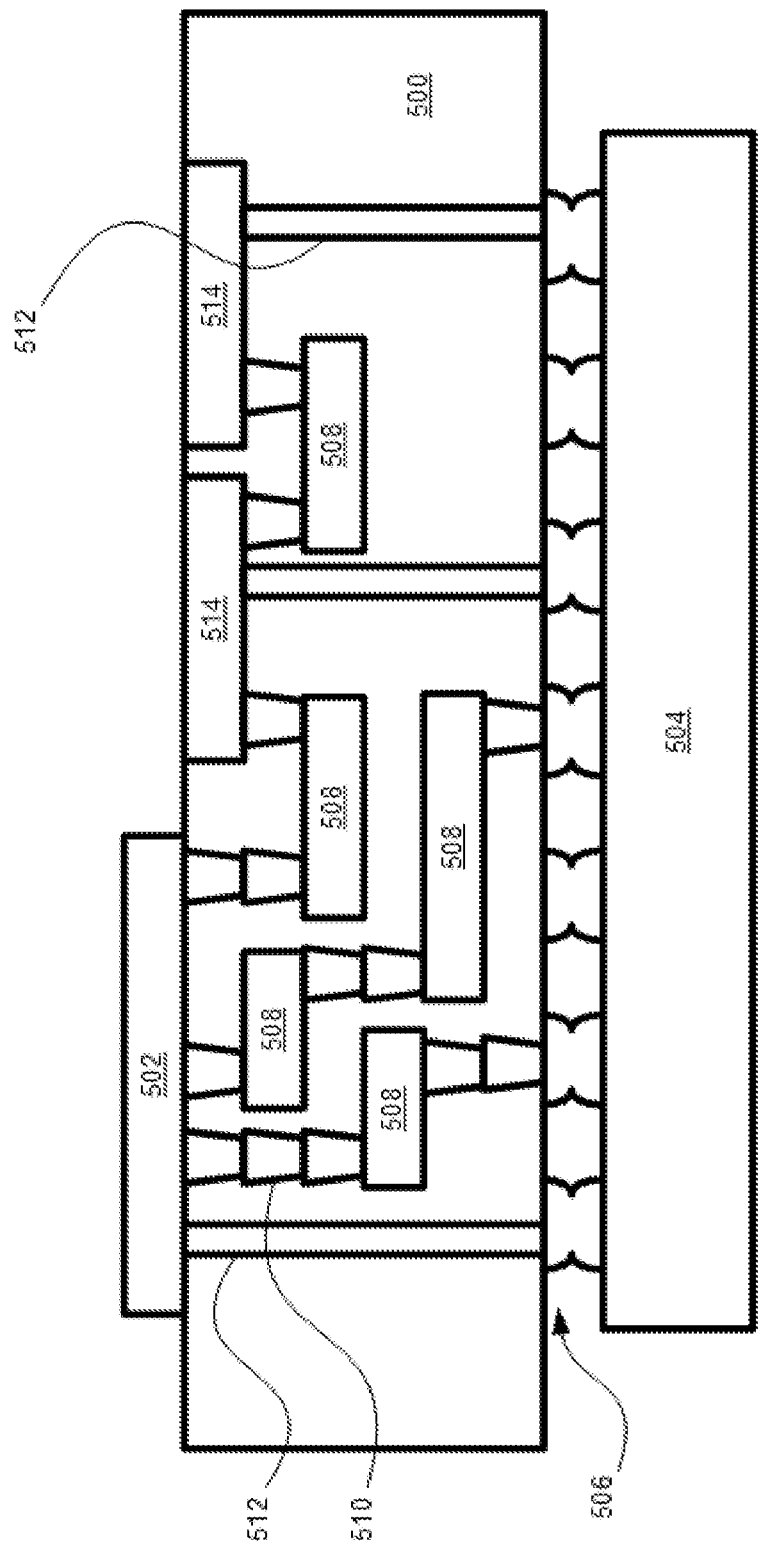
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for a TFT, e.g., the TFT 114 shown in FIG. 1 or the TFT 214 shown in FIG. 2. The second substrate 504 may be, for instance, a memory module, a computer motherboard, or another integrated circuit die. For example, the second substrate 504 may be a memory module including the memory array 100 as shown in FIG. 1. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
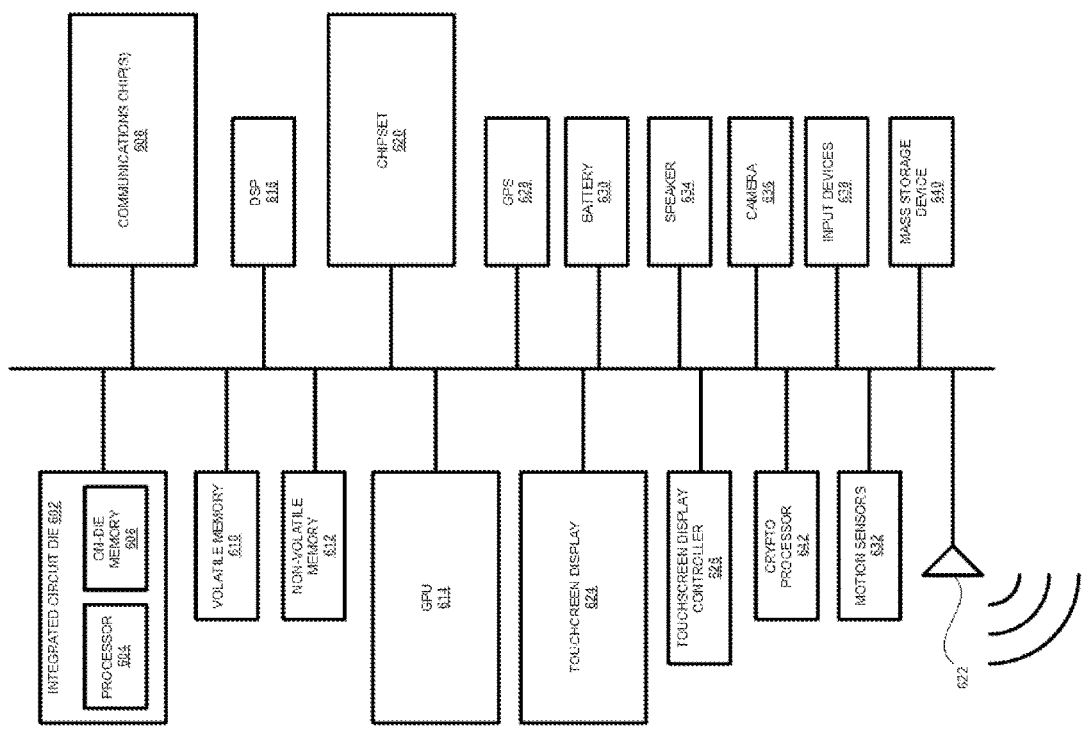
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606 may include the TFT 114 shown in FIG. 1, the TFT 214 shown in FIG. 2, the TFT 314 or the TFT 304 shown in FIG. 3, or a TFT formed according to the process 400 shown in FIG. 4.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others. For example, the touchscreen display 624 may include the TFT 114 shown in FIG. 1, the TFT 214 shown in FIG. 2, the TFT 314 or the TFT 304 shown in FIG. 3, or a TFT formed according to the process 400 shown in FIG. 4.

Computing device 600 may include other components that may or may not be physically and electrically coupled to the motherboard or fabricated within a SoC die.

These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC. and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., the memory array 100 shown in FIG. 1, the TFT 114 shown in FIG. 1, the TFT 214 shown in FIG. 2, the TFT 314 or the TFT 304 shown in FIG. 3, or a TFT formed according to the process 400 shown in FIG. 4.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
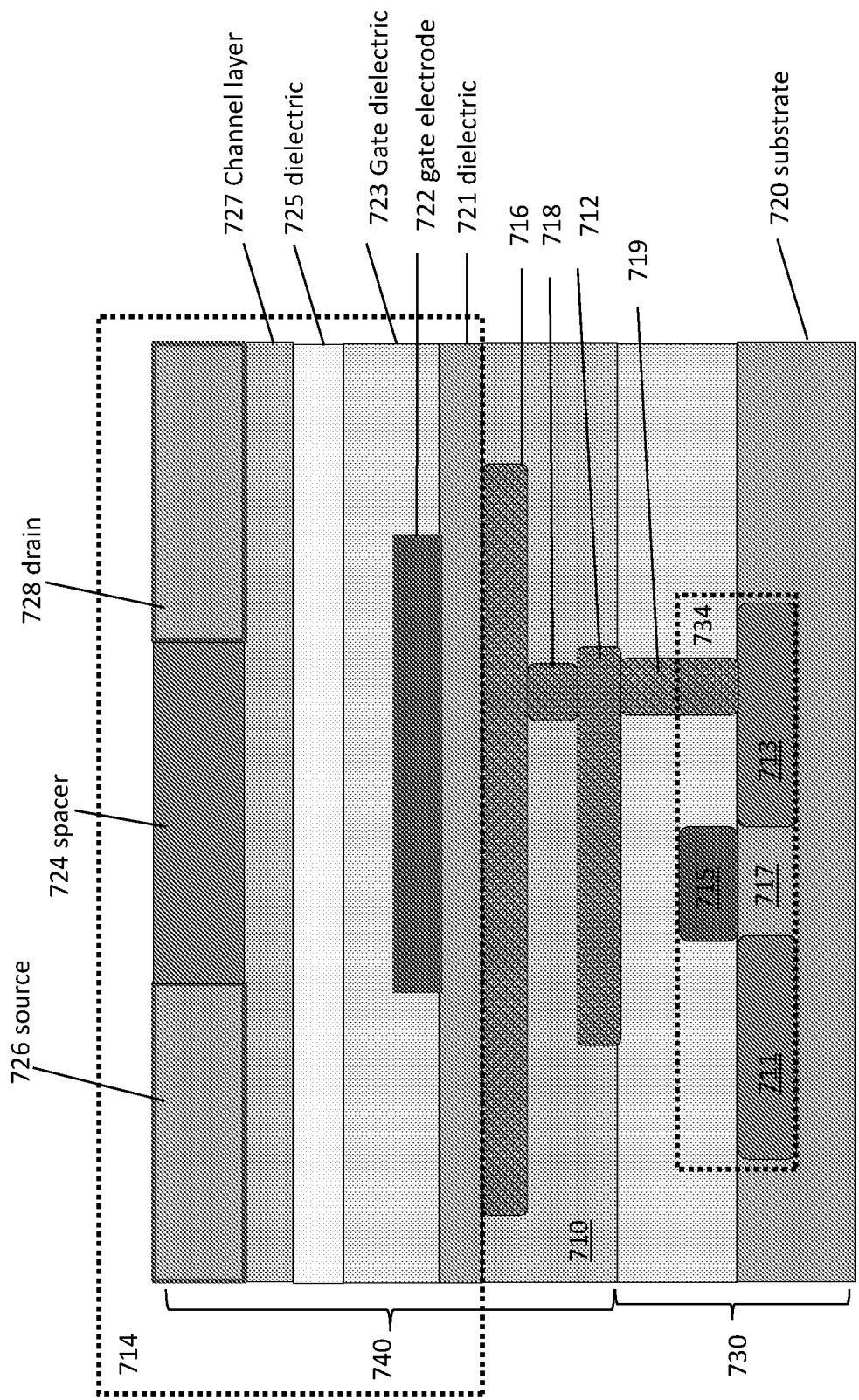
FIG. 7 schematically illustrates a diagram of a TFT having a gate electrode with a gate length determined by a spacer and formed in back-end-of-line (BEOL) on a substrate, in accordance with some embodiments.

FIG. 7 schematically illustrates a diagram of the TFT 714 having a gate electrode 722 with a gate length determined by a spacer 724 and formed in back-end-of-line (BEOL) on a substrate 720, in accordance with some embodiments. The TFT 714 may be an example of the TFT 114 in FIG. 1, an example of the TFT 214 in FIG. 2, or an example of the TFT 314 in FIG. 3. Various layers in the TFT 714 may be similar to corresponding layers in the TFT 214 in FIG. 2, or the TFT 314 in FIG. 3. The structure of the TFT 714 may be for illustration purpose only and is not limiting.

In embodiments, the TFT 714 may be formed on the substrate 720, and may include a dielectric layer 721 above the substrate 720, the gate electrode 722 above the dielectric layer 721, a gate dielectric layer 723 conformally covering the gate electrode 722 and the substrate 720, another dielectric layer 725 above the gate dielectric layer 723, and a channel layer 727 above another dielectric layer 725. In embodiments, another dielectric layer 725 may be similar to another dielectric layer 225 shown in FIG. 2, while the channel layer 727 may be similar to the channel layer 227 shown in FIG. 2. In addition, the TFT 714 may include a source electrode 726, a drain electrode 728, and the spacer 724 above the channel layer 727, where the drain electrode 728 may be separated from the source electrode 726 by the spacer 724. In embodiments, the spacer 724 may overlap with the gate electrode 722. In embodiments, there may be other layers. e.g., a top dielectric layer above the source electrode 726, the drain electrode 728, and the spacer 724, not shown.

In embodiments, the TFT 714 may be formed at the BEOL 740. In addition to the TFT 714, the BEOL 740 may further include a dielectric layer 710, where one or more vias, e.g., a via 718, may be connected to one or more interconnect, e.g., an interconnect 716, and an interconnect 712 within the dielectric layer 710. In embodiments, the interconnect 716 and the interconnect 712 may be of different metal layers at the BEOL 740. The dielectric layer 710 is shown for example only. Although not shown by FIG. 7, in various embodiments there may be multiple dielectric layers included in the BEOL 740.

In embodiments, the BEOL 740 may be formed on the front-end-of-line (FEOL) 730. The FEOL 730 may include the substrate 720. In addition, the FEOL 730 may include other devices, e.g., a transistor 734. In embodiments, the transistor 734 may be a FEOL transistor, including a source 711, a drain 713, and a gate 715, with a channel 717 between the source 711 and the drain 713 under the gate 715. Furthermore, the transistor 734 may be coupled to interconnects, e.g., the interconnect 712, through a via 719.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Some Non-Limiting Examples are Provided Below

Example 1 may include a TFT, comprising: a gate electrode above a substrate; a channel layer above the gate electrode; and a source electrode, a drain electrode, and a spacer, wherein the source electrode, the drain electrode, and the spacer are above the channel layer, the drain electrode is separated from the source electrode by the spacer, the spacer overlaps with the gate electrode, the source electrode has a first width, and the drain electrode has a second width different from the first width.

Example 2 may include the TFT of example 1 and/or some other examples herein, wherein the spacer has a third width that is about 5% to 15% of the first width.

Example 3 may include the TFT of example 1 and/or some other examples herein, wherein the source electrode includes a first conductive material, and the drain electrode includes a second conductive material different from the first conductive material.

Example 4 may include the TFT of example 1 and/or some other examples herein, further comprising: a top dielectric layer above the source electrode, the drain electrode, and the spacer, wherein the spacer includes a first dielectric material, and the top 5 dielectric layer includes a second dielectric material different from the first dielectric material.

Example 5 may include the TFT of example 1 and/or some other examples herein, further comprising: a gate dielectric layer above the gate electrode and below the channel layer, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 6 may include the TFT of any one of examples 1-5 and/or some other examples herein, wherein the source electrode is a first source electrode, the spacer is a first spacer, and the TFT further comprises: a second source electrode above the channel layer, wherein the second source electrode is separated from the first source electrode by a pitch; and a second spacer between the drain electrode and the second source electrode.

Example 7 may include the TFT of any one of examples 1-5 and/or some other examples herein, wherein the channel layer includes amorphous silicon, zinc (Zn), or oxygen (O).

Example 8 may include the TFT of any one of examples 1-5 and/or some other examples herein, wherein the TFT is above an interconnect, and the interconnect is above the substrate.

Example 9 may include a method for forming a TFT, the method comprising: forming a gate electrode above a substrate; forming a gate dielectric layer conformally covering the gate electrode and the substrate; forming a channel layer above the gate dielectric layer; forming a source electrode above the channel layer, wherein the source electrode is separated from another source electrode of an adjacent transistor by a pitch, and the source electrode has a first width; forming a spacer next to the source electrode and above the channel layer, wherein the spacer has a second width, and overlaps with the gate electrode; and forming a drain electrode next to the spacer and above the channel layer, wherein the drain electrode has a third width, and the sum of the first width, the second width, and the third width is less than the pitch.

Example 10 may include the method of example 9 and/or some other examples herein, wherein the source electrode is a first source electrode, the spacer is a first spacer, and the method further comprising: forming a second source electrode above the channel layer, wherein the second source electrode is separated from the first source electrode by the pitch; and forming a second spacer between the drain electrode and the second source electrode and above the channel layer.

Example 11 may include the method of example 9 and/or some other examples herein, wherein the second width is about 5% to 15% of the first width.

Example 12 may include the method of example 9 and/or some other examples herein, where the source electrode includes a first conductive material, and the drain electrode includes a second conductive material different from the first conductive material.

Example 13 may include the method of example 9 and/or some other examples herein, where the first width is different from the third width.

Example 14 may include the method of any one of examples 9-13 and/or some other examples herein, further comprising: forming a top dielectric layer above the source electrode, the drain electrode, and the spacer, wherein the spacer includes a first dielectric material, and the top dielectric layer includes a second dielectric material different from the first dielectric material.

Example 15 may include the method of any one of examples 9-13 and/or some other examples herein, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 16 may include the method of any one of examples 9-13 and/or some other examples herein, wherein the channel layer includes amorphous silicon, zinc (Zn), or oxygen (O).

Example 17 may include the method of any one of examples 9-13 and/or some other examples herein, wherein the source electrode or the drain electrode includes gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), or indium-tin oxide (ITO).

Example 18 may include a computing device, comprising: a circuit board; and a memory device coupled to the circuit board and including a memory array, wherein the memory array includes a plurality of memory cells, a memory cell of the plurality of memory cells includes a transistor and a storage cell, and wherein the transistor includes: a gate electrode coupled to a word line of the memory array; a channel layer above the gate electrode, and a source electrode, a drain electrode, and a spacer, wherein the source electrode, the drain electrode, and the spacer are above the channel layer, the source electrode is coupled to a source line of the memory array, the drain electrode is coupled to the storage cell, the drain electrode is separated from the source electrode by the spacer, the spacer overlaps with the gate electrode, the source electrode has a first width, and the drain electrode has a second width different from the first width; and the storage cell is coupled to a bit line of the memory array.

Example 19 may include the computing device of example 18 and/or some other examples herein, wherein the spacer has a third width that is about 5% to 15% of the first width.

Example 20 may include the computing device of example 18 and/or some other examples herein, wherein the source electrode includes a first conductive material, and the drain electrode includes a second conductive material different from the first conductive material.

Example 21 may include the computing device of any one of examples 18-20 and/or some other examples herein, wherein the transistor further includes: a top dielectric layer above the source electrode, the drain electrode, and the spacer, wherein the spacer includes a first dielectric material, and the top dielectric layer includes a second dielectric material different from the first dielectric material.

Example 22 may include the computing device of any one of examples 18-20 and/or some other examples herein, wherein the transistor further includes: a gate dielectric layer above the gate electrode and below the channel layer; wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 23 may include the computing device of any one of examples 18-20 and/or some other examples herein, wherein the channel layer includes amorphous silicon, zinc (Zn), or oxygen (O).

Example 24 may include the computing device of any one of examples 18-20 and/or some other examples herein, wherein the transistor is above an interconnect, and the interconnect is above a substrate.

Example 25 may include the computing device of any one of examples 18-20 and/or some other examples herein, wherein the memory cell is a first memory cell, the storage cell is a first storage cell, the transistor is a first transistor, the source electrode is a first source electrode, the spacer is a first spacer, the plurality of memory cells further includes a second memory cell, and the second memory cell includes a second transistor including: a second source electrode above the channel layer, wherein the second source electrode is separated from the first source electrode by a pitch, and the second source electrode is coupled to the source line of the memory array; and a second spacer between the drain electrode and the second source electrode.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) comprising:
   a first thin film transistor (TFT) that includes:
      a first gate electrode within a gate dielectric layer above a substrate;
      a channel layer above the first gate electrode;
      a first source electrode, a first drain electrode, and a first spacer, wherein the first source electrode, the first drain electrode, and the first spacer are above the channel layer, the first drain electrode is separated from the first source electrode by the first spacer, the first spacer overlaps with the first gate electrode, wherein a width of the first spacer between the first source electrode and the first drain electrode is substantially equal to a width of the first gate electrode, the first source electrode has a first width, and the drain electrode has a second width different from the first width;
   a second TFT coupled to the first TFT, the second TFT includes:
      a second gate electrode within the gate dielectric layer above the substrate, the channel layer above the second gate electrode;
      a second source electrode, a second drain electrode, and a second spacer,
   wherein the second source electrode, the second drain electrode, and the second spacer are above the channel layer, wherein the second source electrode is separated from the first source electrode by a pitch along a horizontal plane;
   the second spacer positioned between the first drain electrode and the second source electrode and overlapping the second gate electrode; and
   an isolation gate within the gate dielectric layer between the first gate electrode and the second gate electrode, wherein a third spacer between the first drain electrode and the second source electrode overlaps with the isolation gate.

2. The IC of claim 1, wherein the second spacer has a width that is about 5% to 15% of a width of the second gate electrode.

3. The IC of claim 1, wherein the first source electrode includes a first conductive material, and the first drain electrode includes a second conductive material different from the first conductive material.

4. The IC of claim 1, further comprising:
   a top dielectric layer above the first source electrode, the first drain electrode, and the first spacer, wherein the first spacer includes a first dielectric material, and the top dielectric layer includes a second dielectric material different from the first dielectric material.

5. The IC of claim 1, further comprising:
   a gate dielectric layer above the gate electrode and below the channel layer, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

6. The IC of claim 1, wherein the channel layer includes amorphous silicon, zinc (Zn), or oxygen (O).

7. The IC of claim 1, wherein the TFT is above an interconnect, and the interconnect is above the substrate.

8. A computing device, comprising:

a circuit board; and a memory device coupled to the circuit board and including a memory array, wherein the memory array includes a plurality of memory cells, a memory cell of the plurality of memory cells includes an integrated circuit (IC) and a storage cell, and wherein the IC includes:

a first thin film transistor (TFT) that includes:

a first gate electrode coupled to a first word line of the memory array;

a channel layer above the first gate electrode;

a first source electrode, a first drain electrode, and a first spacer, wherein the first source electrode, the first drain electrode, and the first spacer are above the channel layer, the first source electrode is coupled to a first source line of the memory array, the first drain electrode is coupled to the storage cell, the first drain electrode is separated from the first source electrode by the first spacer, the first spacer overlaps with the first gate electrode, wherein a width of the first spacer between the first source electrode and the first drain electrode is greater than or equal to a width of die first gate electrode, the first source electrode has a first width, and the first drain electrode has a second width different from the first width;

a second TFT coupled to the first TFT, the second TFT includes:

a second gate electrode coupled to a second word line of the memory array;

a second source electrode, a second drain electrode, and a second spacer, wherein the second source electrode, the second drain electrode, and the second spacer are above the channel layer, wherein the second source electrode is separated from the first source electrode by a pitch along a horizontal plane;

the second spacer positioned between the first drain electrode and the second source electrode; and an isolation gate within a gate dielectric layer between the first gate electrode and the second gate electrode, wherein a third spacer between the first drain electrode and the second source electrode overlaps with the isolation gate; and wherein the storage cell is coupled to a bit line of the memory array.

9. The computing device of claim 8, wherein the second first spacer has a width that is about 5% to 15% of a width of the second sate electrode.

10. The computing device of claim 8, wherein the first source electrode includes a first conductive material, and the first drain electrode includes a second conductive material different from the first conductive material.

11. The computing device of claim 8, wherein the TFT further includes:

a top dielectric layer above the first source electrode, the first drain electrode, and the first spacer, wherein the first spacer includes a first dielectric material, and the top dielectric layer includes a second dielectric material different from the first dielectric material.

12. The computing device of claim 8, wherein the IC further includes:

a gate dielectric layer above the first gate electrode and below the channel layer; wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

13. The computing device of claim 8, wherein the channel layer includes amorphous silicon, zinc (Zn), or oxygen (O).

14. The computing device of claim 8, wherein the IC is above an interconnect, and the interconnect is above a substrate.

* * * * *

UNITED STATES PATENT AND TRADEMARK OFFICE
CERTIFICATE OF CORRECTION

PATENT NO. : 11,296,087 B2
APPLICATION NO. : 16/473592
DATED : April 5, 2022
INVENTOR(S) : Abhishek A. Sharma et al.

It is certified that error appears in the above-identified patent and that said Letters Patent is hereby corrected as shown below:

In the Claims

Column 19
Line 24, "...die first gate electrode..." should read "...the first gate electrode..."

Column 20
Line 12, "...the second sate electrode." should read "...the second gate electrode."

Signed and Sealed this
Twenty-first Day of June, 2022

Katherine Kelly Vidal
*Director of the United States Patent and Trademark Office*